United States Patent
Nomaru

(10) Patent No.: US 11,538,724 B2
(45) Date of Patent: Dec. 27, 2022

(54) PROCESSING METHOD OF WORKPIECE WITH LASER POWER ADJUSTMENT BASED ON THICKNESS MEASUREMENT AND PROCESSING APPARATUS THEREOF

(71) Applicant: DISCO CORPORATION, Tokyo (JP)

(72) Inventor: Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 198 days.

(21) Appl. No.: 17/065,961

(22) Filed: Oct. 8, 2020

(65) Prior Publication Data

US 2021/0118755 A1 Apr. 22, 2021

(30) Foreign Application Priority Data

Oct. 16, 2019 (JP) .............................. JP2019-189678

(51) Int. Cl.
*H01L 21/66* (2006.01)
*B23K 26/12* (2014.01)
(Continued)

(52) U.S. Cl.
CPC .......... *H01L 22/26* (2013.01); *B23K 26/0626* (2013.01); *B23K 26/126* (2013.01);
(Continued)

(58) Field of Classification Search
CPC ..... H01L 22/26; H01L 21/268; H01L 21/304; H01L 21/67092; H01L 21/67115; H01L 21/67253; H01L 21/302; H01L 21/3065; H01L 21/306; H01L 21/67017; H01L 22/12; B23K 26/0626; B23K 26/126; B23K 26/127; B23K 26/402; B23K 26/0622; B23K 26/0643; B23K 26/0648;
(Continued)

(56) References Cited

U.S. PATENT DOCUMENTS 5,795,493 A * 8/1998 Bukhman ........... H01L 21/3065
216/60
6,033,721 A * 3/2000 Nassuphis ............. C23C 16/047
427/586

FOREIGN PATENT DOCUMENTS

JP  06122985 A  5/1994
JP  2007123638 A * 5/2007
(Continued)

OTHER PUBLICATIONS

Office action issued in counterpart German patent application No. 10 2020 213 011.6, dated Apr. 22, 2022, pp. 1-5.

*Primary Examiner* — John P. Dulka
(74) *Attorney, Agent, or Firm* — Greer Burns & Crain Ltd.

(57) ABSTRACT

A processing method of a workpiece used when the workpiece is processed is provided. The processing method of a workpiece includes a disposing step of disposing the workpiece in a gas containing a substance that generates an active species that reacts with the workpiece, a measurement step of measuring the distribution of the thickness of the workpiece disposed in the gas, and a laser beam irradiation step of irradiating the workpiece in the gas with a laser beam of which the power is adjusted based on the distribution of the thickness measured in the measurement step. In the laser beam irradiation step, the removal amount by which a region irradiated with the laser beam in the workpiece is removed by the active species is controlled by irradiating the workpiece with the laser beam of which the power is adjusted.

18 Claims, 6 Drawing Sheets

(51) Int. Cl.
*B23K 26/402* (2014.01)
*H01L 21/268* (2006.01)
*H01L 21/304* (2006.01)
*H01L 21/67* (2006.01)
*B23K 26/06* (2014.01)
*B23K 103/00* (2006.01)
*B23K 26/0622* (2014.01)
*B23K 26/082* (2014.01)

(52) U.S. Cl.
CPC .......... *B23K 26/127* (2013.01); *B23K 26/402* (2013.01); *H01L 21/268* (2013.01); *H01L 21/304* (2013.01); *H01L 21/67092* (2013.01); *H01L 21/67115* (2013.01); *H01L 21/67253* (2013.01); *B23K 26/0622* (2015.10); *B23K 26/0643* (2013.01); *B23K 26/0648* (2013.01); *B23K 26/0665* (2013.01); *B23K 26/0821* (2015.10); *B23K 2103/56* (2018.08)

(58) Field of Classification Search
CPC ............ B23K 26/0665; B23K 26/0821; B23K 2103/56; B23K 26/36
See application file for complete search history.

(56) References Cited

FOREIGN PATENT DOCUMENTS

| | | |
|---|---|---|
| JP | 2007123638 A | 5/2007 |
| JP | 2011224758 A | 11/2011 |
| JP | 2013115381 A | 6/2013 |

* cited by examiner

PROCESSING METHOD OF WORKPIECE WITH LASER POWER ADJUSTMENT BASED ON THICKNESS MEASUREMENT AND PROCESSING APPARATUS THEREOF

BACKGROUND OF THE INVENTION

Field of the Invention

The present invention relates to a processing method of a workpiece and a processing apparatus used when a workpiece such as a wafer is processed.

Description of the Related Art

In electronic equipment typified by mobile phones and personal computers, a device chip including a device such as an electronic circuit is an essential constituent element. For example, the device chip is obtained by segmenting a wafer including a semiconductor material such as silicon (Si) into plural regions by planned dividing lines (streets), forming a device in each region, and thereafter dividing this wafer along the planned dividing lines.

Incidentally, the wafer is processed by a method of chemical mechanical polishing (CMP) or the like in a manufacturing process of the above-described device chip in some cases. For example, while a polishing liquid (slurry) in which abrasive grains are dispersed is supplied to a workpiece such as a wafer, this workpiece is rubbed by a polishing pad. This can adjust the thickness of the workpiece and enhance the flatness of the workpiece.

In recent years, there has been proposed a technique in which the relation between the period of time consumed for polishing and the change amount of the thickness of a workpiece is obtained and the period of time for polishing with which the workpiece with a target thickness is obtained is set based on this relation (for example, refer to Japanese Patent Laid-open No. 2011-224758). It becomes easier to obtain the workpiece with the target thickness by setting the period of time for polishing based on the relation obtained from the result of actually-executed polishing as in this technique.

Furthermore, there has also been proposed a technique in which the flatness of a workpiece is enhanced by combining a recipe used when a flat workpiece is polished, a recipe used when a workpiece that warps into a mountain form is polished, and a recipe used when a workpiece that warps into a valley form is polished (for example, refer to Japanese Patent Laid-open No. 2013-115381). In this technique, the possibility of warpage of the workpiece after the polishing is suppressed to be low by properly adjusting the period of time for which each recipe is applied.

SUMMARY OF THE INVENTION

Incidentally, in the above-described method in which the period of time for polishing is set based on the relation obtained from the actual result, the workpiece can not necessarily be processed into the target thickness when the thickness of the workpiece involves variation or the workpiece warps. In the method in which the period of time for which each recipe is applied is adjusted, similarly, the workpiece can not necessarily be processed flatly when variation in the thickness of the workpiece is large or irregular recesses and protrusions exist in the workpiece.

Thus, an object of the present invention is to provide a new processing method of a workpiece and a new processing apparatus that allow a workpiece to be processed with high accuracy.

In accordance with an aspect of the present invention, there is provided a processing method of a workpiece used when the workpiece is processed. The processing method includes a disposing step of disposing the workpiece in a gas containing a substance that generates an active species that reacts with the workpiece, a measurement step of measuring the distribution of the thickness of the workpiece disposed in the gas, and a laser beam irradiation step of irradiating the workpiece in the gas with a laser beam of which the power is adjusted based on the distribution of the thickness measured in the measurement step. In the laser beam irradiation step, a removal amount by which a region irradiated with the laser beam in the workpiece is removed by the active species is controlled by irradiating the workpiece with the laser beam of which the power is adjusted.

In accordance with another aspect of the present invention, there is provided a processing method of a workpiece used when the workpiece is processed. The processing method includes a disposing step of disposing the workpiece in a liquid containing a substance that generates an active species that reacts with the workpiece, a measurement step of measuring the distribution of the thickness of the workpiece disposed in the liquid, and a laser beam irradiation step of irradiating the workpiece in the liquid with a laser beam of which the power is adjusted based on the distribution of the thickness measured in the measurement step. In the laser beam irradiation step, a removal amount by which a region irradiated with the laser beam in the workpiece is removed by the active species is controlled by irradiating the workpiece with the laser beam of which the power is adjusted.

Preferably, the processing method of a workpiece further includes a remeasurement step of remeasuring the distribution of the thickness of the workpiece after the laser beam irradiation step is started and a readjustment step of readjusting the power of the laser beam based on the distribution of the thickness remeasured in the remeasurement step. Further, the remeasurement step and the readjustment step are alternately repeated while the laser beam irradiation step is continued.

Preferably, the laser beam irradiation step is ended when it is indicated that the workpiece has been processed into a target shape by the distribution of the thickness remeasured in the remeasurement step.

Preferably, in the laser beam irradiation step, by avoiding irradiation of a thin region of the workpiece indicated by the distribution of the thickness with the laser beam and irradiating a thick region of the workpiece with the laser beam or by raising the power of the laser beam with which a thick region of the workpiece is irradiated compared with the laser beam with which a thin region of the workpiece is irradiated, a removal amount by which the thick region of the workpiece is removed by the active species is made larger than a removal amount by which the thin region of the workpiece is removed by the active species.

In accordance with a further aspect of the present invention, there is provided a processing method of a workpiece used when the workpiece is processed. The processing method includes a disposing step of disposing the workpiece in a liquid containing an active species that reacts with the workpiece, a measurement step of measuring the distribution of the thickness of the workpiece disposed in the liquid, and a laser beam irradiation step of irradiating the workpiece in the liquid with a laser beam of which the power is adjusted based on the distribution of the thickness measured in the measurement step. In the laser beam irradiation step, a removal amount by which a region irradiated with the laser beam in the workpiece is removed by the active species is controlled by irradiating the workpiece with the laser beam of which the power is adjusted.

Preferably, the processing method of a workpiece further includes a remeasurement step of remeasuring the distribution of the thickness of the workpiece after the laser beam irradiation step is started and a readjustment step of readjusting the power of the laser beam based on the distribution of the thickness remeasured in the remeasurement step. Further, the remeasurement step and the readjustment step are alternately repeated while the laser beam irradiation step is continued.

Preferably, the laser beam irradiation step is ended when it is indicated that the workpiece has been processed into a target shape by the distribution of the thickness remeasured in the remeasurement step.

Preferably, in the laser beam irradiation step, by avoiding irradiation of a thin region of the workpiece indicated by the distribution of the thickness with the laser beam and irradiating a thick region of the workpiece with the laser beam or by raising the power of the laser beam with which a thick region of the workpiece is irradiated compared with the laser beam with which a thin region of the workpiece is irradiated, a removal amount by which the thick region of the workpiece is removed by the active species is made larger than a removal amount by which the thin region of the workpiece is removed by the active species.

Preferably, in the laser beam irradiation step, by avoiding irradiation of a thick region of the workpiece indicated by the distribution of the thickness with the laser beam and irradiating a thin region of the workpiece with the laser beam or by raising the power of the laser beam with which a thin region of the workpiece is irradiated compared with the laser beam with which a thick region of the workpiece is irradiated, a removal amount by which the thin region of the workpiece is removed by the active species is made smaller than a removal amount by which the thick region of the workpiece is removed by the active species.

Preferably, the processing method of a workpiece further includes a pre-processing step of processing the workpiece by any method of grinding, polishing, and etching before the disposing step is executed.

In accordance with a still further aspect of the present invention, there is provided a processing apparatus used when a workpiece is processed. The processing apparatus includes a supply unit that supplies, to the workpiece, a gas containing a substance that generates an active species that reacts with the workpiece, a liquid containing a substance that generates an active species that reacts with the workpiece, or a liquid containing an active species that reacts with the workpiece, a measuring unit used when the distribution of the thickness of the workpiece is measured, a laser beam irradiation unit having an adjuster that adjusts the power of a laser beam, and a control unit that controls the adjuster based on the distribution of the thickness of the workpiece measured by using the measuring unit.

Preferably, the processing apparatus further includes a container in which the workpiece is housed. Further, a window that allows the laser beam with which irradiation is executed from the outside of the container to be transmitted through the window is disposed in the container.

In the processing methods of a workpiece and the processing apparatus according to the respective aspects of the present invention, the removal amount of the workpiece removed by the active species is controlled by adjusting the power of the laser beam with which the workpiece is irradiated. Thus, the workpiece can be processed with high accuracy by properly adjusting the power of the laser beam according to the distribution of the thickness of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
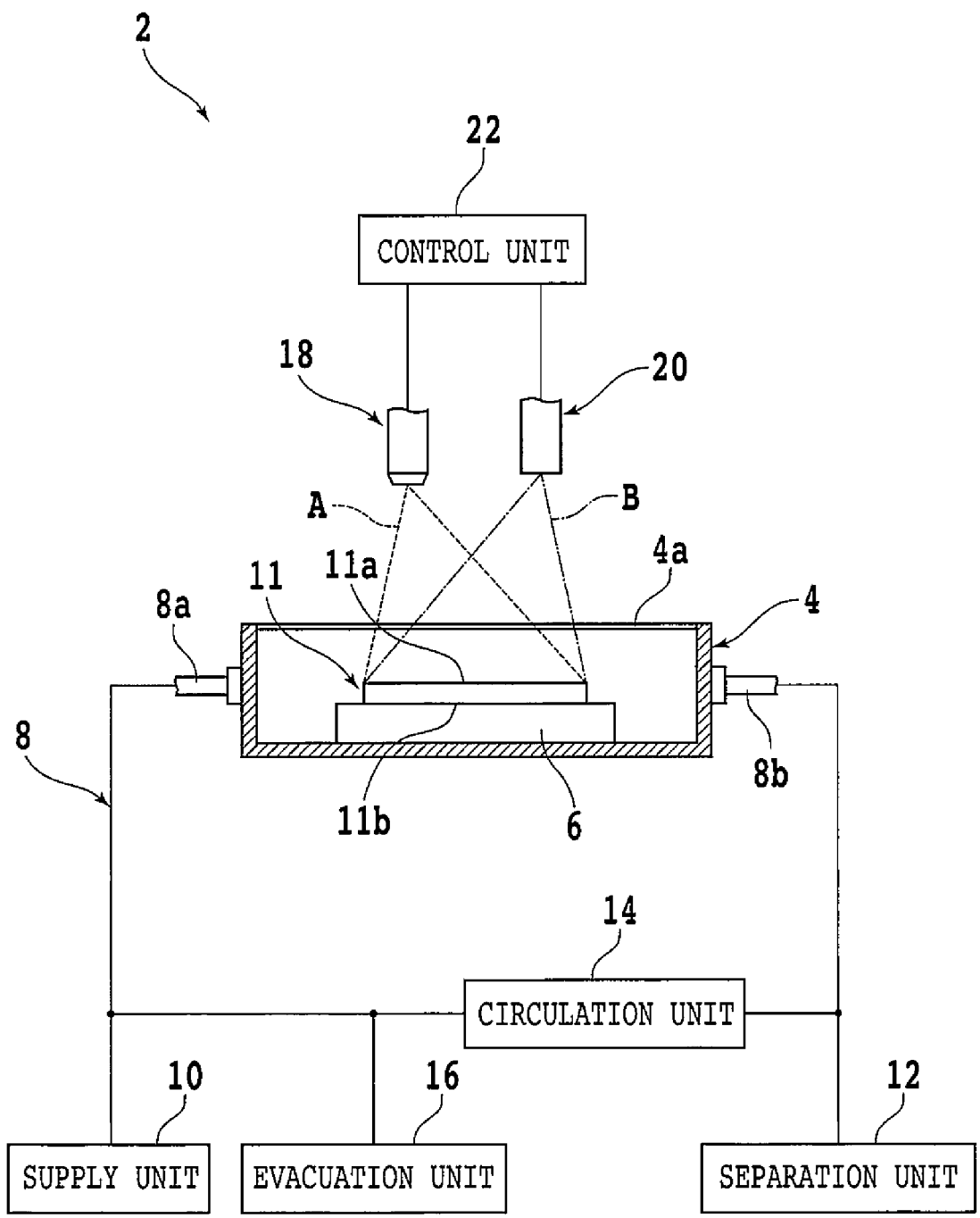
FIG. 1 is a diagram depicting a configuration example of a processing apparatus.

An embodiment of the present invention will be described with reference to the accompanying drawings. FIG. 1 is a diagram depicting a configuration example of a processing apparatus 2 according to the present embodiment. In FIG. 1, part of constituent elements of the processing apparatus 2 is depicted by functional blocks.

The processing apparatus 2 is configured to be capable of processing a workpiece 11 by using a substance in a high reactivity state (hereinafter, active species), such as ions and radicals, and includes a container 4 inside which the workpiece 11 can be housed as depicted in FIG. 1. For example, the container 4 is formed into a box shape with a material that is unlikely to react with active species and so forth and has a window 4a that allows transmission of light in the visible range through it at an upper part. A table 6 that can support the workpiece 11 is disposed inside the container 4.

Typically the workpiece 11 is a circular-disc-shaped wafer (semiconductor wafer) formed by using a semiconductor such as Si. However, there is no limit on the material, shape, structure, size, and so forth of the workpiece 11. For example, it is also possible to use a substrate or the like formed by using another semiconductor, ceramic, resin, metal, or the like as the workpiece 11.

Two openings (not depicted) that allow passing of a gas through them are formed at side parts of the container 4. One end part 8a of a pipe 8 disposed outside the container 4 is connected to one opening. The other end part 8b of the pipe 8 is connected to the other opening. That is, the two openings are connected to each other through the pipe 8, and an annular flow path in which a gas flows is implemented by the container 4 and the pipe 8.

To the part on the upstream side relative to the container 4 in the pipe 8 that forms the flow path, a supply unit 10 that can supply the pipe 8 with a gas containing a substance that generates active species that react with the workpiece 11 is connected. For example, the supply unit 10 includes a valve that can control the amount of flow of the gas and adjusts the amount of flow of the gas supplied from a gas cylinder or the like connected to the supply unit 10 to the pipe 8.

When the workpiece 11 formed by using Si is processed, for example, chlorine ($Cl_2$) is selected as the substance that generates the active species. In this case, a chlorine gas is used as the gas containing the substance that generates the active species. That is, a gas cylinder or the like filled with the chlorine gas is connected to the supply unit 10. However, the substance that generates the active species and the gas containing this substance can be optionally changed according to the material and so forth of the workpiece 11.

When the workpiece 11 is irradiated with a laser beam to excite electrons in the valence band of Si to the conduction band in the state in which the workpiece 11 is disposed in the chlorine gas, the excited electrons (free electrons) are passed to $Cl_2$, and $Cl^-$ having high reactivity is generated. As a result, the Si that forms the workpiece 11 reacts with the $Cl^-$ and becomes $SiCl_4$ to be removed from the workpiece 11. That is, in this case, the workpiece 11 is processed by the $Cl^-$, which is an active species.

To the part on the downstream side relative to the container 4 in the pipe 8 that forms the flow path, a separation unit 12 that separates and removes an unnecessary substance (for example, $SiCl_4$) generated due to the processing of the workpiece 11 (reaction with the workpiece 11) from the gas that flows in the pipe 8 is connected. For example, the separation unit 12 includes an apparatus that is called a cold trap or the like and removes the unnecessary substance generated due to the processing of the workpiece 11 from the gas that flows in the pipe 8 by using difference in the vapor pressure between the substance that generates the active species (for example, $Cl_2$) and the substance generated due to the processing of the workpiece 11.

A circulation unit 14 that circulates the gas along the annular flow path implemented by the container 4 and the pipe 8 is disposed between the part to which the supply unit 10 is connected in the pipe 8 and the part to which the separation unit 12 is connected in the pipe 8. The circulation unit 14 is a circulator, for example, and sends the gas that has been discharged from the container 4 and from which the unnecessary substance has been removed by the separation unit 12 to the container 4 again.

An evacuation unit 16 is connected to the part between the part to which the supply unit 10 is connected in the pipe 8 and the circulation unit 14. For example, the evacuation unit 16 includes a vacuum pump such as an ejector and properly reduces the pressure of the annular flow path made by the container 4 and the pipe 8 to implement an environment in which the active species is easily generated.

A laser beam irradiation unit 18 that can irradiate the workpiece 11 in the container 4 with a laser beam A from the outside of the container 4 through the window 4a is disposed above the container 4. Further, a measuring unit 20 used when the distribution of the thickness of the workpiece 11 in the container 4 is measured from the outside of the container 4 is disposed above the container 4. A control unit 22 is connected to the laser beam irradiation unit 18 and the measuring unit 20.

The control unit 22 controls operation of the laser beam irradiation unit 18 and the measuring unit 20 in conformity to the target shape of the workpiece 11. Typically the control unit 22 is configured by a computer including a processing apparatus such as a central processing unit (CPU) and a storing apparatus such as a flash memory. Various functions of the control unit 22 are implemented by operating the processing apparatus and so forth according to software stored in the storing apparatus.

Figure 2:
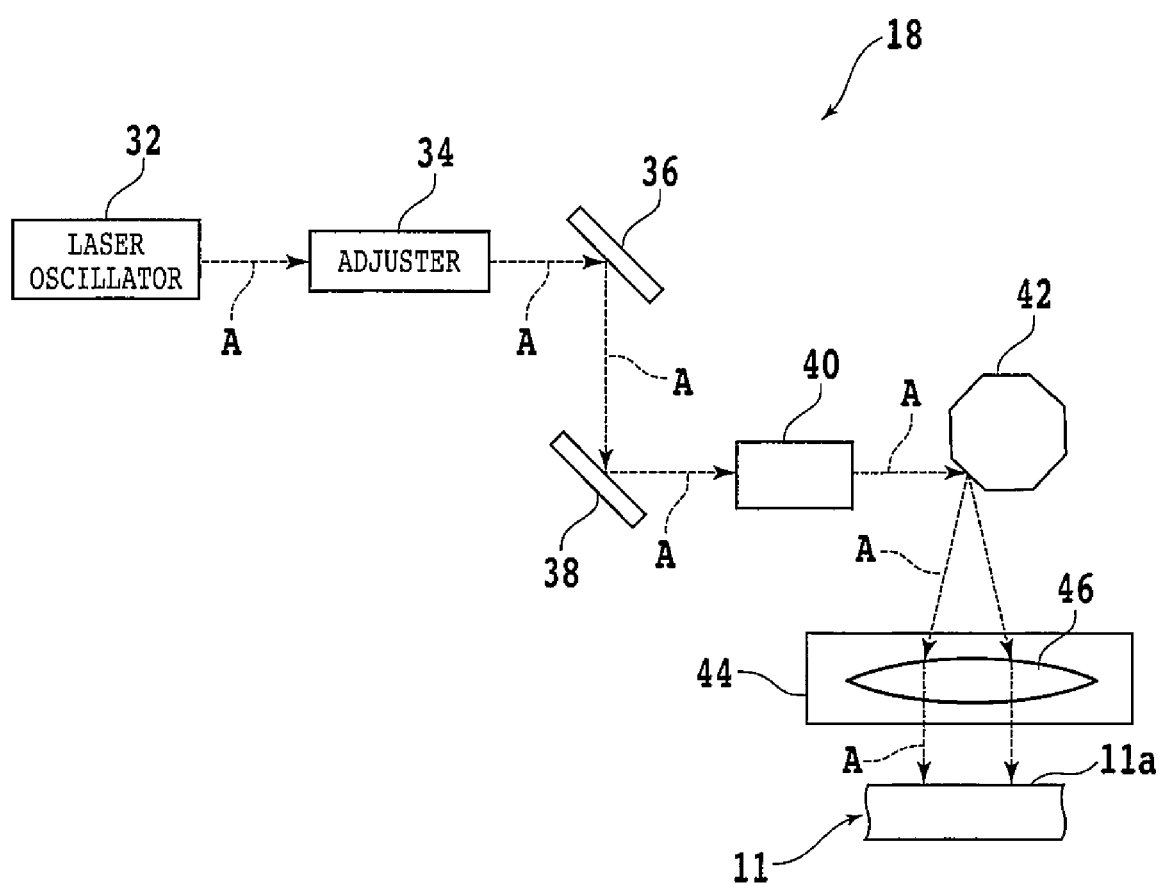
FIG. 2 is a diagram depicting a configuration example of a laser beam irradiation unit.

FIG. 2 is a diagram depicting a configuration example of the laser beam irradiation unit 18. Also in FIG. 2, part of constituent elements is depicted by functional blocks. As depicted in FIG. 2, the laser beam irradiation unit 18 includes a laser oscillator 32 that can generate the laser beam A with such a wavelength as to be absorbed by the workpiece 11.

For example, when the workpiece 11 formed by using Si is processed, the laser oscillator 32 that can generate the laser beam A with a wavelength of 532 nm is used. However, the laser oscillator 32 may be configured to be capable of generating a laser beam with another wavelength.

Further, the form of laser oscillation executed in the laser oscillator 32 may be either continuous wave (CW) oscillation or pulse oscillation. The efficiency of processing of the workpiece 11 is higher in the case of using a laser beam generated by the continuous wave oscillation than in the case of using a laser beam generated by the pulse oscillation. Thus, the laser oscillator 32 capable of the continuous wave oscillation is used in the present embodiment. On the other hand, in the case of using a laser beam generated by the pulse oscillation, it becomes easy to enhance the accuracy of processing compared with the case of using a laser beam generated by the continuous wave oscillation.

An adjuster 34 such as an attenuator that can adjust the power of the laser beam A radiated from the laser oscillator 32 is disposed at a position adjacent to the laser oscillator 32. A power adjusting section of the control unit 22 is connected to the adjuster 34, and operation of the adjuster 34 is controlled by the power adjusting section of the control unit 22.

The laser beam A of which the power is adjusted by the adjuster 34 is reflected by mirrors 36 and 38 or the like, for example, and thereafter is incident on an acousto-optic deflector (laser beam scanning unit) 40. The acousto-optic deflector 40 changes the traveling direction of the laser beam A according to the frequency of a supplied high-frequency voltage (radio frequency (RF) voltage).

The laser beam A of which traveling direction is changed by the acousto-optic deflector 40 is incident on a polygon mirror (laser beam scanning unit) 42 having plural reflective surfaces. The polygon mirror 42 is connected to a rotational drive source (not depicted) such as a motor. By rotating the polygon mirror 42, the traveling direction of the laser beam A reflected by the reflective surface of the polygon mirror 42 is changed. The rotation speed of the polygon mirror 42 is approximately 5,000 rpm to 30,000 rpm, for example.

An upper surface 11a of the workpiece 11 is irradiated with the laser beam A reflected by the polygon mirror 42 through a light collector 44 and the window 4a (FIG. 1). That is, the window 4a is configured to allow the laser beam A with which irradiation is executed from the outside of the container 4 to be transmitted through it. The light collector 44 includes an fθ lens 46 and focuses the laser beam A on the upper surface 11a of the workpiece 11 irrespective of the traveling direction thereof. The diameter of the laser beam A on the upper surface 11a of the workpiece 11 is approximately 3 μm to 1,000 μm, for example.

In the present embodiment, the position of the region irradiated with the laser beam A is changed in a first direction substantially parallel to the upper surface 11a by the acousto-optic deflector 40 and is changed in a second direction that is substantially parallel to the upper surface 11a and is substantially perpendicular to the first direction by the polygon mirror 42. That is, scanning with the laser beam A is executed based on the combination of the change in the traveling direction of the laser beam A by the acousto-optic deflector 40 and the change in the traveling direction of the laser beam A by the polygon mirror 42.

When scanning with the laser beam A is executed while the power of the laser beam A is adjusted by the adjuster 34, an optional region on the upper surface 11a of the workpiece 11 can be irradiated with the laser beam A with optional power. In the processing apparatus 2 of the present embodiment, the removal amount by which the workpiece 11 is removed by an active species is controlled regarding each region by controlling the power of the laser beam A and the region irradiated with the laser beam A.

Figure 3:
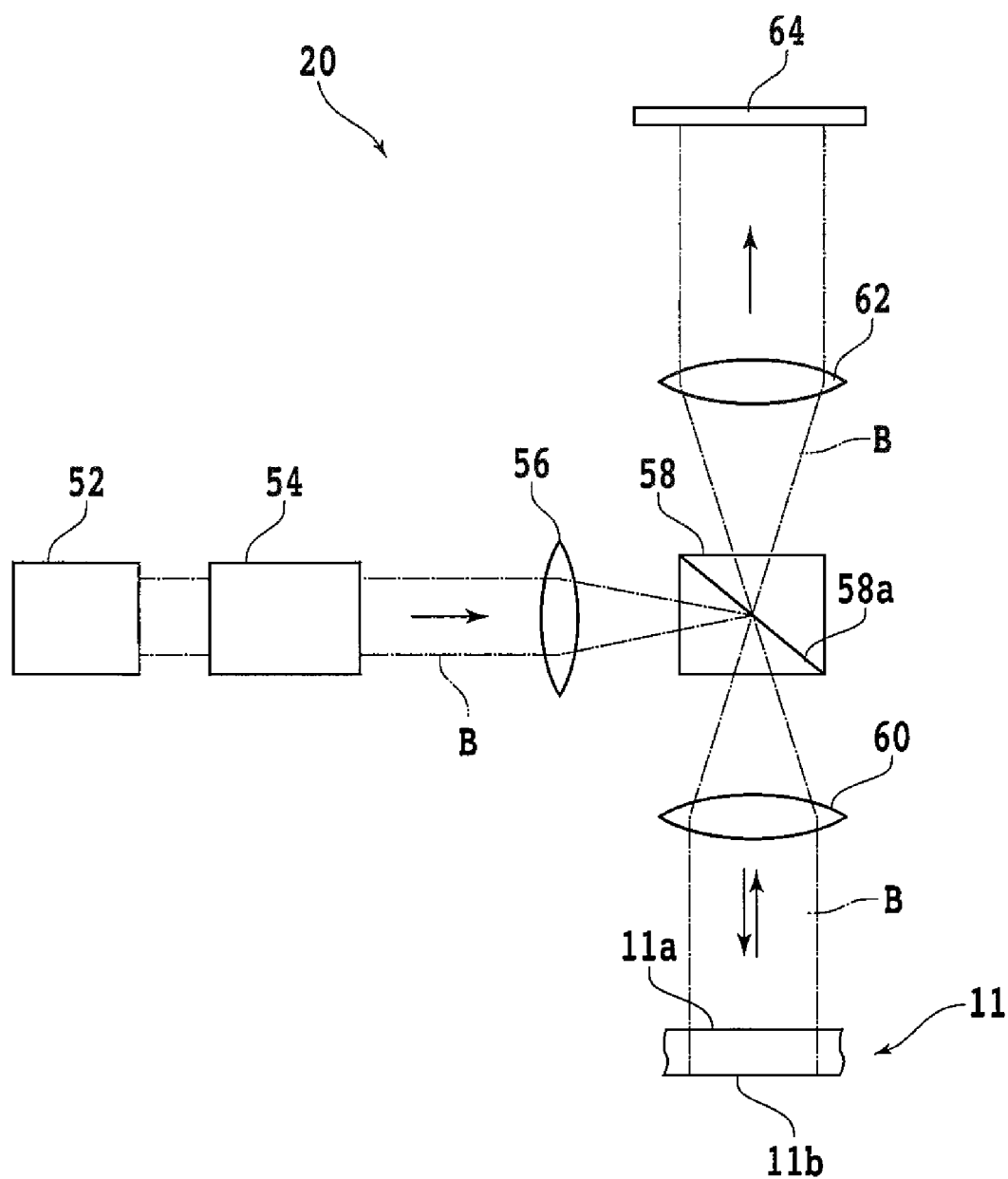
FIG. 3 is a diagram depicting a configuration example of a measuring unit.

FIG. 3 is a diagram depicting a configuration example of the measuring unit 20. As depicted in FIG. 3, the measuring unit 20 includes a white light source 52 that can generate white light including light in the visible range. As the white light source 52, for example, a super luminescent diode (SLD) light source, an amplified spontaneous emission (ASE) light source, a supercontinuum (SC) light source, a light emitting diode (LED) light source, a halogen lamp, a xenon lamp, a mercury lamp, a metal halide lamp, or the like is selected.

A spectroscopic unit 54 that can split the white light radiated from the white light source 52 into light of each wavelength is disposed at a position adjacent to the white light source 52. For example, the spectroscopic unit 54 includes an optical fiber or the like with large wavelength dispersion and radiates light of each wavelength configuring the white light to the backside at a timing different for each wavelength by using the propagation speed of light different according to the wavelength. For example, when pulsed white light is made incident on the spectroscopic unit 54, the wavelength of light radiated from the spectroscopic unit 54 changes from the shorter wavelength side to the longer wavelength side over time.

Light B radiated from the spectroscopic unit 54 is incident on a beam splitter 58 through a lens 56 or the like, for example. The beam splitter 58 is typically a half mirror and reflects, by a reflective surface 58a, part of the light B that is radiated from the spectroscopic unit 54 and passes through the lens 56 or the like to change the traveling direction thereof. The upper surface 11a and a lower surface 11b of the workpiece 11 are irradiated with the light B reflected by the beam splitter 58 through a telecentric lens 60 and the window 4a (FIG. 1).

The light B reflected by the upper surface 11a of the workpiece 11 and the light B reflected by the lower surface 11b of the workpiece 11 are each incident on the beam splitter 58 again through the window 4a and the telecentric lens 60, and part thereof is transmitted through the reflective surface 58a. The light B transmitted through the reflective surface 58a is turned to collimated light by a lens 62 or the like and is incident on a two-dimensional imaging unit 64.

The two-dimensional imaging unit 64 includes an imaging element such as a charge-coupled device (CCD) image sensor or a complementary metal oxide semiconductor (CMOS) image sensor. When receiving light having two-dimensional intensity distribution, the two-dimensional imaging unit 64 generates an electrical signal in which the intensity distribution of the light is reflected. Specifically, by the two-dimensional imaging unit 64, information relating to the two-dimensional intensity distribution generated through superposition (interference) between the light reflected by the upper surface 11a of the workpiece 11 and the light reflected by the lower surface 11b can be acquired.

As described above, the spectroscopic unit 54 radiates the light of each wavelength configuring the white light radiated from the white light source 52 to the backside at a timing different for each wavelength. Thus, if the intensity distribution of the light incident on the two-dimensional imaging unit 64 is acquired at different plural timings, information relating to the two-dimensional intensity distribution of light of different plural wavelengths corresponding to the respective timings can be acquired.

The two-dimensional imaging unit 64 is connected to a thickness distribution calculating section of the control unit 22 (FIG. 1). The information relating to the two-dimensional intensity distribution of the light acquired in the two-dimensional imaging unit 64 is sent to the thickness distribution calculating section of the control unit 22. The thickness distribution calculating section of the control unit 22 calculates the distribution of the thickness of the workpiece 11 from the information relating to the two-dimensional intensity distribution of the light of the different plural wavelengths acquired in the two-dimensional imaging unit 64.

Information relating to the distribution of the thickness of the workpiece 11 is sent to a removal amount calculating section of the control unit 22. The removal amount calculating section calculates the removal amount of the workpiece 11 that should be removed by an active species regarding each region based on the information relating to the distribution of the thickness of the workpiece 11 received from the thickness distribution calculating section and information relating to the target shape of the workpiece 11 (distribution of the target thickness).

Information relating to the calculated removal amount is sent to the power adjusting section of the control unit 22. The power adjusting section controls operation of the adjuster 34 to adjust the power of the laser beam A with which each region of the workpiece 11 is irradiated in such a manner that an active species in an amount corresponding to the calculated removal amount is generated.

Figure 4:
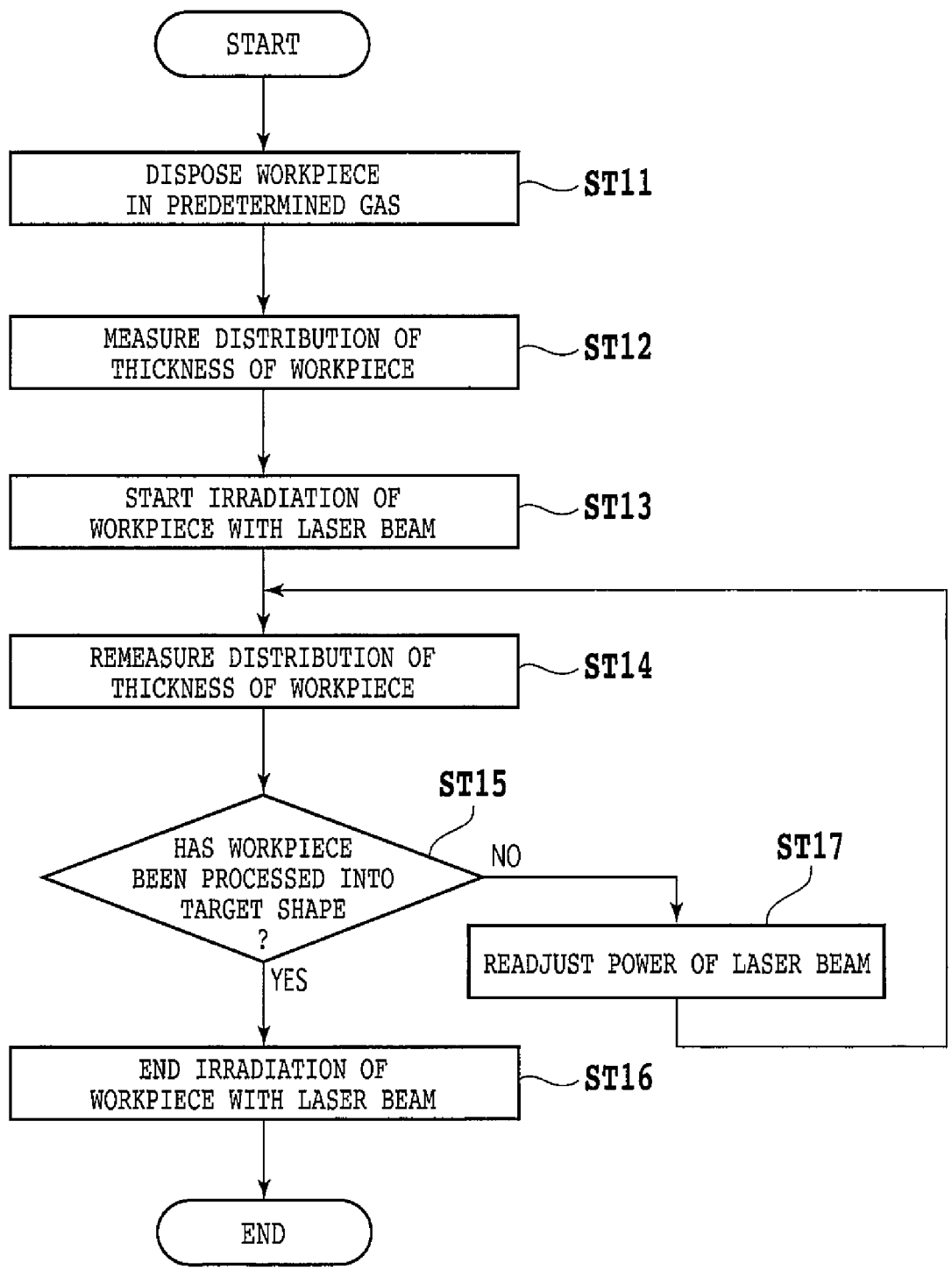
FIG. 4 is a flowchart depicting a processing method of a workpiece.

Next, a processing method of a workpiece executed by using the above-described processing apparatus 2 will be described. FIG. 4 is a flowchart depicting the processing method of a workpiece. In the processing method of a workpiece according to the present embodiment, first, the workpiece 11 is disposed in a predetermined gas containing a substance that generates an active species that reacts with the workpiece 11 (disposing step ST11).

Specifically, first, the workpiece 11 is placed on the table 6 in the container 4, and the container 4 is sealed. In the present embodiment, a wafer formed by using Si is employed as the workpiece 11. Next, the inside of the container 4 and the inside of the pipe 8 are evacuated by the evacuation unit 16 in such a manner that the pressure in the container 4 becomes 400 Torr or lower, for example.

Thereafter, while the gas containing the substance that generates the active species that reacts with the workpiece 11 is supplied from the supply unit 10 to the pipe 8, the gas in the container 4 and in the pipe 8 is circulated by the circulation unit 14. In the present embodiment, a chlorine gas is used as the gas containing the substance that generates the active species that reacts with the workpiece 11.

After the workpiece 11 is disposed in the predetermined gas, the distribution of the thickness of the workpiece 11 is measured (measurement step ST12). In the present embodiment, the distribution of the thickness is measured in the whole of the workpiece 11 by the measuring unit 20. Specifically, pulsed white light radiated from the white light source 52 is split into light of each wavelength by the spectroscopic unit 54, and the workpiece 11 is irradiated with the light. Then, information relating to the two-dimensional intensity distribution of the light of each wavelength reflected by the workpiece 11 is acquired by the two-dimensional imaging unit 64.

After the information relating to the two-dimensional intensity distribution of the light of each wavelength is acquired, the distribution of the thickness of the workpiece 11 is calculated by the thickness distribution calculating section of the control unit 22. Specifically, the distribution of the thickness of the workpiece 11 is calculated from information relating to the two-dimensional intensity distribution of light of different plural wavelengths by using the conditions of interference different for each wavelength between the light reflected by the upper surface 11a of the workpiece 11 and the light reflected by the lower surface 11b. This information relating to the distribution of the thickness is sent to the removal amount calculating section of the control unit 22.

After the distribution of the thickness of the workpiece 11 is measured, irradiation of the workpiece 11 with the laser beam A is started (laser beam irradiation step ST13). In the present embodiment, by the laser beam irradiation unit 18, the workpiece 11 in the gas is irradiated with the laser beam A of which the power is adjusted based on the information relating to the distribution of the thickness.

Specifically, first, the removal amount calculating section of the control unit 22 calculates the removal amount of the workpiece 11 that should be removed regarding each region from the information relating to the distribution of the thickness of the workpiece 11 and information relating to the target shape of the workpiece 11 (distribution of the target thickness). That is, the difference between the thickness of the workpiece 11 in each region and the target thickness is calculated as the removal amount.

Information relating to this removal amount is sent to the power adjusting section of the control unit 22. When receiving the information relating to the removal amount, the power adjusting section controls operation of the adjuster 34 to adjust the power of the laser beam A with which each region of the workpiece 11 is irradiated in such a manner that the active species in an amount corresponding to the removal amount is generated.

This can irradiate each region of the workpiece 11 in the gas with the laser beam A of which the power is adjusted based on the information relating to the distribution of the thickness. When each region of the workpiece 11 is irradiated with the laser beam A, electrons in an amount according to the power of the laser beam A with which the irradiation is executed are excited in each region of the workpiece 11, and Cl⁻ (active species) in an amount according to the amount of excited electrons is generated in the vicinity of each region.

As a result, each region of the workpiece 11 is removed by Cl⁻ generated in the vicinity. The removal amount of each region corresponds to the amount of generated Cl⁻. That is, the removal amount of each region depends on the power of the laser beam A. Thus, by irradiating each region of the workpiece 11 with the laser beam A of which the power is adjusted as described in the present embodiment, the removal amount by which each region irradiated with the laser beam A in the workpiece 11 is removed by the active species can be controlled.

For example, by avoiding irradiation of a thin region of the workpiece 11 indicated by the distribution of the thickness with the laser beam A and irradiating a thick region of the workpiece 11 with the laser beam A, the removal amount by which the thick region of the workpiece 11 is removed by the active species can be made larger than the removal amount by which the thin region of the workpiece 11 is removed by the active species.

Further, for example, by raising the power of the laser beam A with which a thick region of the workpiece 11 is irradiated compared with the laser beam A with which a thin region of the workpiece 11 is irradiated, the removal amount by which the thick region of the workpiece 11 is removed by the active species can be made larger than the removal amount by which the thin region of the workpiece 11 is removed by the active species.

After the irradiation of the workpiece 11 with the laser beam A is started, the distribution of the thickness of the workpiece 11 is remeasured (remeasurement step ST14). This remeasurement is executed by a method similar to the above-described first round of measurement. Information relating to the remeasured distribution of the thickness is sent to the removal amount calculating section of the control unit 22.

After the distribution of the thickness of the workpiece 11 is remeasured, whether or not the workpiece 11 has been processed into the target shape is determined (determination step ST15). Specifically, the removal amount calculating section of the control unit 22 calculates the removal amount of the workpiece 11 that should be removed regarding each region from the information relating to the remeasured distribution of the thickness and the information relating to the target shape of the workpiece 11 (distribution of the target thickness).

For example, if none of the removal amounts of the respective regions calculated by the removal amount calculating section exceeds an amount as a basis (range in which the shape of the workpiece 11 after the processing is permissible as the target shape), the control unit 22 determines that the workpiece 11 has been processed into the target shape. In this case (determination step ST15: YES), the control unit 22 ends the irradiation of the workpiece 11 with the laser beam A (irradiation end step ST16). That is, the control unit 22 ends the processing of the workpiece 11.

In contrast, for example, if any of the removal amounts of the respective regions calculated by the removal amount calculating section exceeds the amount as the basis (range in which the shape of the workpiece 11 after the processing is permissible as the target shape), the control unit 22 determines that the workpiece 11 has not been processed into the target shape. In this case (determination step ST15: NO), the control unit 22 readjusts the power of the laser beam A with which the workpiece 11 is irradiated (readjustment step ST17).

Specifically, the power adjusting section of the control unit 22 receives information relating to the removal amount calculated based on the remeasured distribution of the thickness and readjusts the power of the laser beam A with which each region of the workpiece 11 is irradiated in such a manner that the active species in an amount corresponding to this removal amount is generated. After the power of the laser beam A is readjusted, the distribution of the thickness of the workpiece 11 is remeasured at a predetermined timing (remeasurement step ST14).

By alternately repeating the remeasurement of the distribution of the thickness of the workpiece 11 and the readjustment of the power of the laser beam A based on the remeasured distribution of the thickness as above, processing of the workpiece 11 with high accuracy is enabled. There is no particular limit on the frequency (or cycle) relating to the repetition of the remeasurement of the distribution of the thickness and the readjustment of the power of the laser beam A. However, processing of the workpiece 11 with high accuracy is facilitated by raising this frequency to a certain extent (shortening the cycle to a certain extent). For example, it is preferable to set the frequency of the repetition to 0.5 Hz to 1 kHz inclusive.

As above, in the processing method of a workpiece and the processing apparatus according to the present embodiment, the removal amount of the workpiece 11 removed by the active species is controlled by adjusting the power of the laser beam A with which the workpiece 11 is irradiated. Thus, the workpiece 11 can be processed with high accuracy by properly adjusting the power of the laser beam A according to the distribution of the thickness of the workpiece 11.

The present invention is not limited to the description of the above-described embodiment and can be carried out with various changes. For example, before the workpiece 11 is disposed in the gas containing the substance that generates the active species that reacts with the workpiece 11, the workpiece 11 may be processed by any method of grinding, polishing, and etching (chemical etching) (pre-processing step).

Further, in the above-described embodiment, the laser beam irradiation unit 18 that irradiates each region with the laser beam A by using the acousto-optic deflector 40 and the polygon mirror 42 is exemplified. However, there is no particular limit on the structure of the laser beam irradiation unit 18 included in the processing apparatus 2. For example, the laser beam irradiation unit 18 that irradiates each region with the laser beam A by using a galvanometer scanner, a diffractive optical element (DOE), a liquid crystal on silicon (LCOS), a digital micromirror device (DMD), or the like may be employed.

Figure 5:
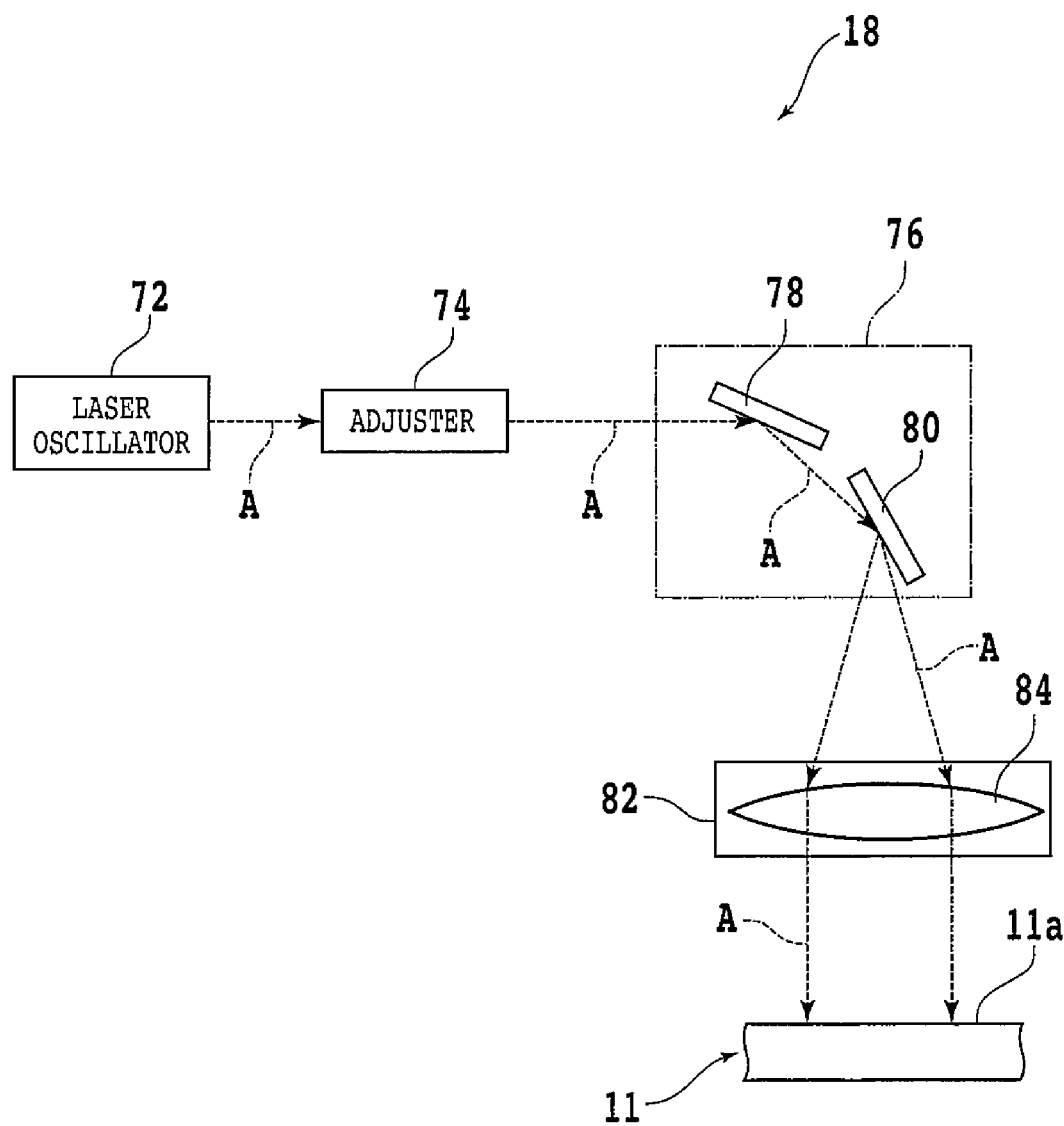
FIG. 5 is a diagram depicting a modification example of the laser beam irradiation unit.

FIG. 5 is a diagram depicting a modification example of the laser beam irradiation unit 18. In FIG. 5, part of constituent elements is depicted by functional blocks. The laser beam irradiation unit 18 according to the modification example includes a laser oscillator 72 that can generate the laser beam A. An adjuster 74 such as an attenuator that can adjust the power of the laser beam A is disposed at a position adjacent to the laser oscillator 72. The laser oscillator 72 and the adjuster 74 may be components equivalent to the laser oscillator 32 and the adjuster 34 of the above-described embodiment.

The laser beam A of which the power is adjusted by the adjuster 74 is incident on a galvanometer scanner 76. The galvanometer scanner 76 includes a first mirror 78 and a second mirror 80. The first mirror 78 is connected to a rotational drive source (not depicted) such as a motor and rotates around a first axis. Similarly, the second mirror 80 is connected to a rotational drive source (not depicted) such as a motor and rotates around a second axis perpendicular to the first axis.

The traveling direction of the laser beam A is controlled by adjusting the angle of the first mirror 78 around the first axis and the angle of the second mirror 80 around the second axis. The upper surface 11a of the workpiece 11 is irradiated with the laser beam A reflected by the galvanometer scanner 76 through a light collector 82 and the window 4a (FIG. 1). The light collector 82 includes an fθ lens 84 and focuses the laser beam A on the upper surface 11a of the workpiece 11 irrespective of the traveling direction thereof. The diameter of the laser beam A on the upper surface 11a of the workpiece 11 is approximately 3 μm to 1,000 μm, for example.

In the present embodiment, the position of the region irradiated with the laser beam A is changed in a first direction substantially parallel to the upper surface 11a by the first mirror 78 and is changed in a second direction that is substantially parallel to the upper surface 11a and is substantially perpendicular to the first direction by the second mirror 80. That is, scanning with the laser beam A is executed by the first mirror 78 and the second mirror 80 configuring the galvanometer scanner 76.

Further, in the processing method of a workpiece according to the above-described embodiment, the workpiece 11 is processed by using the gas containing the substance that generates the active species that reacts with the workpiece 11. However, it is also possible to process the workpiece 11 by using a liquid containing the active species that reacts with the workpiece 11. The structure of the processing apparatus used at this time may be similar to the structure of the processing apparatus 2. However, the supply unit 10 is configured to be capable of supplying the liquid containing the active species that reacts with the workpiece 11 to the pipe 8. That is, an annular flow path in which the liquid flows is implemented by the container 4 and the pipe 8.

Further, the separation unit 12 is configured to be capable of removing an unnecessary substance generated due to the processing of the workpiece 11 from the liquid that flows in the pipe 8, and the circulation unit 14 is configured to be capable of circulating the liquid along the annular flow path implemented by the container 4 and the pipe 8. The separation unit 12, the circulation unit 14, the evacuation unit 16, and so forth may be omitted.

Figure 6:
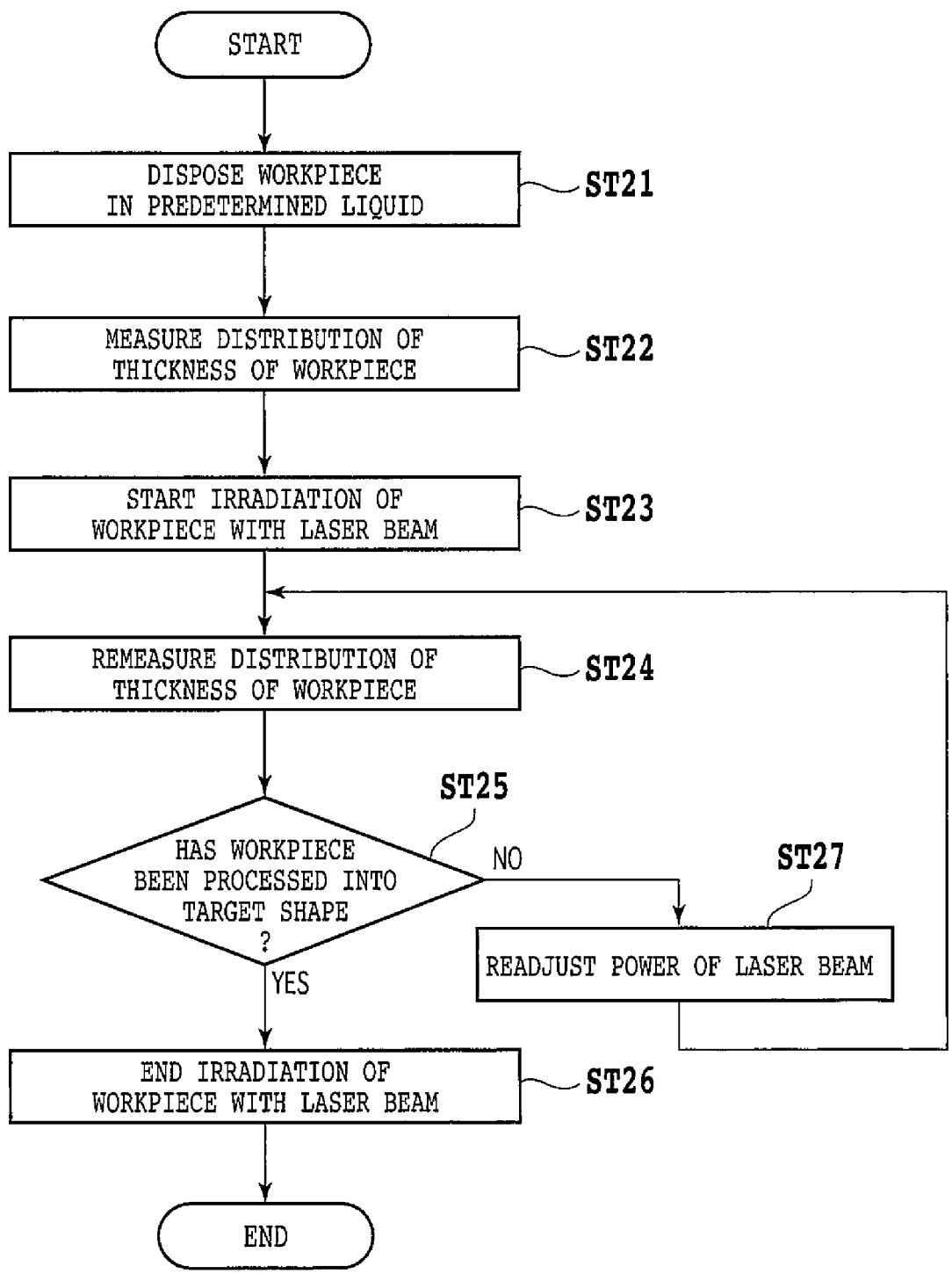
FIG. 6 is a flowchart depicting a modification example of the processing method of a workpiece.

FIG. 6 is a flowchart depicting a modification example of the processing method of a workpiece. Most part of the processing method of a workpiece according to the modification example is in common with the processing method of a workpiece according to the above-described embodiment. Thus, in the following, the different points will be mainly described. In the processing method of a workpiece according to the modification example, first, the workpiece 11 is disposed in a liquid containing an active species that reacts with the workpiece 11 (disposing step ST21).

Specifically, first, the workpiece 11 is placed on the table 6 in the container 4, and the container 4 is sealed. In the present modification example, a wafer formed by using Si is employed as the workpiece 11. Thereafter, the liquid containing the active species that reacts with the workpiece 11 is supplied from the supply unit 10 to the pipe 8 and is circulated by the circulation unit 14.

In the present modification example, an aqueous solution of potassium hydroxide (KOH) is used as the liquid containing the active species that reacts with the workpiece 11. However, there is no particular limit on the liquid containing the active species that reacts with the workpiece 11. For example, it is also possible to use an aqueous solution of tetramethylammonium hydroxide (TMAH), hydrazine, ethylenediamine pyrocatechol (EDP), or the like.

After the workpiece 11 is disposed in the predetermined liquid, the distribution of the thickness of the workpiece 11 is measured (measurement step ST22). Details of the method for measuring the distribution of the thickness are similar to those of the above-described embodiment. After the distribution of the thickness of the workpiece 11 is measured, irradiation of the workpiece 11 with the laser beam A is started (laser beam irradiation step ST23). In the present modification example, by the laser beam irradiation unit 18, the workpiece 11 in the liquid is irradiated with the laser beam A of which the power is adjusted based on information relating to the distribution of the thickness.

For example, when the workpiece 11 is irradiated with the laser beam A in the state in which the workpiece 11 is disposed in an aqueous solution of KOH, the temperature of the region irradiated with the laser beam A in the workpiece 11 rises, and the speed of reaction between Si and OH⁻ rises. In the present modification example, the removal amount of the workpiece 11 is adjusted by using this phenomenon. That is, in the present modification example, the workpiece 11 is processed by OH⁻ that is the active species.

Specifically, first, the removal amount calculating section of the control unit 22 calculates the removal amount of the workpiece 11 that should be removed regarding each region from the information relating to the distribution of the thickness of the workpiece 11 and information relating to the target shape of the workpiece 11 (distribution of the target thickness). That is, the difference between the thickness of the workpiece 11 in each region and the target thickness is calculated as the removal amount.

Information relating to this removal amount is sent to the power adjusting section of the control unit 22. When receiving the information relating to the removal amount, the power adjusting section controls operation of the adjuster 34 to adjust the power of the laser beam A with which each region of the workpiece 11 is irradiated in such a manner that a speed of reaction corresponding to the removal amount is implemented.

This can irradiate each region of the workpiece 11 in the liquid with the laser beam A of which the power is adjusted based on the information relating to the distribution of the thickness. When the irradiation with the laser beam A is executed, each region of the workpiece 11 is removed at the speed of reaction according to the power of the laser beam A with which the irradiation is executed. By irradiating each region of the workpiece 11 with the laser beam A of which the power is adjusted as above, the removal amount by which each region irradiated with the laser beam A in the workpiece 11 is removed by the active species can be controlled.

For example, by avoiding irradiation of a thin region of the workpiece 11 indicated by the distribution of the thickness with the laser beam A and irradiating a thick region of the workpiece 11 with the laser beam A, the removal amount by which the thick region of the workpiece 11 is removed by the active species can be made larger than the removal amount by which the thin region of the workpiece 11 is removed by the active species.

Further, for example, by raising the power of the laser beam A with which a thick region of the workpiece 11 is irradiated compared with the laser beam A with which a thin region of the workpiece 11 is irradiated, the removal amount by which the thick region of the workpiece 11 is removed by the active species can be made larger than the removal amount by which the thin region of the workpiece 11 is removed by the active species.

After the irradiation of the workpiece 11 with the laser beam A is started, the distribution of the thickness of the workpiece 11 is remeasured (remeasurement step ST24). After the distribution of the thickness of the workpiece 11 is remeasured, whether or not the workpiece 11 has been processed into the target shape is determined (determination step ST25). Then, according to the result of this determination, irradiation of the workpiece 11 with the laser beam A is ended (irradiation end step ST26), or the power of the laser beam A with which the workpiece 11 is irradiated is readjusted (readjustment step ST27).

Also in the processing method of a workpiece according to the above-described modification example, before the workpiece 11 is disposed in the liquid containing the active species that reacts with the workpiece 11, the workpiece 11 can be processed by any method of grinding, polishing, and etching (chemical etching) (pre-processing step).

Further, in the processing method of a workpiece according to the above-described modification example, the speed of the reaction between Si and OH⁻ in the workpiece 11 may be lowered by irradiating the workpiece 11 with the laser beam A and forming an oxide film ($SiO_2$) with a thickness according to the power of the laser beam A on the upper surface 11a of the workpiece 11. In this case, it is preferable to add an additive such as ozone ($O_3$) or hydrogen peroxide ($H_2O_2$) into the liquid, so that the formation of the oxide film may be facilitated.

For example, by avoiding irradiation of a thick region of the workpiece 11 indicated by the distribution of the thickness with the laser beam A and irradiating a thin region of the workpiece 11 with the laser beam A, the removal amount by which the thin region of the workpiece 11 is removed by the active species can be made smaller than the removal amount by which the thick region of the workpiece 11 is removed by the active species.

Further, for example, by raising the power of the laser beam A with which a thin region of the workpiece 11 is irradiated compared with the laser beam A with which a thick region of the workpiece 11 is irradiated, the removal amount by which the thin region of the workpiece 11 is removed by the active species can be made smaller than the removal amount by which the thick region of the workpiece 11 is removed by the active species.

Moreover, in the above-described modification example, the workpiece 11 is processed by using the liquid containing the active species that reacts with the workpiece 11. However, the workpiece 11 may be processed by using a liquid containing a substance that generates an active species that reacts with the workpiece 11. That is, in this case, the active species is generated by irradiation with the laser beam A. The structure of a processing apparatus may be the same as the processing apparatus used in the above-described modification example.

Besides, structures, methods, and so forth according to the above-described embodiment and modification example can be implemented with changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of processing wafer as a workpiece, the processing method comprising:
   a disposing step of disposing the workpiece in a gas containing a substance that generates an active species that reacts with the workpiece;
   a measurement step of measuring distribution of thickness of the workpiece disposed in the gas; and
   a laser beam irradiation step of irradiating the workpiece in the gas with a laser beam of which power is adjusted based on the distribution of the thickness measured in the measurement step, wherein
   in the laser beam irradiation step, a removal amount, by which a region irradiated with the laser beam in the workpiece is removed by the active species, is controlled by irradiating the workpiece with the laser beam of which the power is adjusted,
   wherein during the processing of the wafer, the gas is circulated along an annular flow path including a separation unit that separates and removes an unnecessary substance generated due to the processing of the workpiece from the gas.

2. The processing method of a workpiece according to claim 1, further comprising:
a remeasurement step of remeasuring the distribution of the thickness of the workpiece after the laser beam irradiation step is started; and
a readjustment step of readjusting the power of the laser beam based on the distribution of the thickness remeasured in the remeasurement step, wherein
the remeasurement step and the readjustment step are alternately repeated while the laser beam irradiation step is continued.

3. The processing method of a workpiece according to claim 2, wherein
the laser beam irradiation step is ended when it is indicated that the workpiece has been processed into a target shape by the distribution of the thickness remeasured in the remeasurement step.

4. The processing method of a workpiece according to claim 1, wherein
in the laser beam irradiation step, by avoiding irradiation of a thin region of the workpiece indicated by the distribution of the thickness with the laser beam and irradiating a thick region of the workpiece with the laser beam or by raising the power of the laser beam with which a thick region of the workpiece is irradiated compared with the laser beam with which a thin region of the workpiece is irradiated, a removal amount by which the thick region of the workpiece is removed by the active species is made larger than a removal amount by which the thin region of the workpiece is removed by the active species.

5. The processing method of a workpiece according to claim 1, further comprising:
a pre-processing step of processing the workpiece by any method of grinding, polishing, and etching before the disposing step is executed.

6. A processing method of processing a wafer as a workpiece, the processing method comprising:
a disposing step of disposing the workpiece in a liquid containing a substance that generates an active species that reacts with the workpiece;
a measurement step of measuring distribution of thickness of the workpiece disposed in the liquid; and
a laser beam irradiation step of irradiating the workpiece in the liquid with a laser beam of which power is adjusted based on the distribution of the thickness measured in the measurement step, wherein
in the laser beam irradiation step, a removal amount, by which a region irradiated with the laser beam in the workpiece is removed by the active species, is controlled by irradiating the workpiece with the laser beam of which the power is adjusted.

7. The processing method of a workpiece according to claim 6, further comprising:
a remeasurement step of remeasuring the distribution of the thickness of the workpiece after the laser beam irradiation step is started; and
a readjustment step of readjusting the power of the laser beam based on the distribution of the thickness remeasured in the remeasurement step, wherein
the remeasurement step and the readjustment step are alternately repeated while the laser beam irradiation step is continued.

8. The processing method of a workpiece according to claim 7, wherein
the laser beam irradiation step is ended when it is indicated that the workpiece has been processed into a target shape by the distribution of the thickness remeasured in the remeasurement step.

9. The processing method of a workpiece according to claim 6, wherein
in the laser beam irradiation step, by avoiding irradiation of a thin region of the workpiece indicated by the distribution of the thickness with the laser beam and irradiating a thick region of the workpiece with the laser beam or by raising the power of the laser beam with which a thick region of the workpiece is irradiated compared with the laser beam with which a thin region of the workpiece is irradiated, a removal amount by which the thick region of the workpiece is removed by the active species is made larger than a removal amount by which the thin region of the workpiece is removed by the active species.

10. The processing method of a workpiece according to claim 6, further comprising:
a pre-processing step of processing the workpiece by any method of grinding, polishing, and etching before the disposing step is executed.

11. A processing method of processing a wafer as a workpiece, the processing method comprising:
a disposing step of disposing the workpiece in a liquid containing an active species that reacts with the workpiece;
a measurement step of measuring distribution of thickness of the workpiece disposed in the liquid; and
a laser beam irradiation step of irradiating the workpiece in the liquid with a laser beam of which power is adjusted based on the distribution of the thickness measured in the measurement step, wherein
in the laser beam irradiation step, a removal amount, by which a region irradiated with the laser beam in the workpiece is removed by the active species, is controlled by irradiating the workpiece with the laser beam of which the power is adjusted.

12. The processing method of a workpiece according to claim 11, further comprising:
a remeasurement step of remeasuring the distribution of the thickness of the workpiece after the laser beam irradiation step is started; and
a readjustment step of readjusting the power of the laser beam based on the distribution of the thickness remeasured in the remeasurement step, wherein
the remeasurement step and the readjustment step are alternately repeated while the laser beam irradiation step is continued.

13. The processing method of a workpiece according to claim 12, wherein
the laser beam irradiation step is ended when it is indicated that the workpiece has been processed into a target shape by the distribution of the thickness remeasured in the remeasurement step.

14. The processing method of a workpiece according to claim 11, wherein
in the laser beam irradiation step, by avoiding irradiation of a thin region of the workpiece indicated by the distribution of the thickness with the laser beam and irradiating a thick region of the workpiece with the laser beam or by raising the power of the laser beam with which a thick region of the workpiece is irradiated compared with the laser beam with which a thin region of the workpiece is irradiated, a removal amount by which the thick region of the workpiece is removed by the active species is made larger than a removal amount by which the thin region of the workpiece is removed by the active species.

15. The processing method of a workpiece according to claim 11, wherein in the laser beam irradiation step, by avoiding irradiation of a thick region of the workpiece indicated by the distribution of the thickness with the laser beam and irradiating a thin region of the workpiece with the laser beam or by raising the power of the laser beam with which a thin region of the workpiece is irradiated compared with the laser beam with which a thick region of the workpiece is irradiated, a removal amount by which the thin region of the workpiece is removed by the active species is made smaller than a removal amount by which the thick region of the workpiece is removed by the active species.

16. The processing method of a workpiece according to claim 11, further comprising:

a pre-processing step of processing the workpiece by any method of grinding, polishing, and etching before the disposing step is executed.

17. A processing apparatus for processing a wafer as a workpiece, the processing apparatus comprising:

a supply unit that supplies, to the workpiece, a gas containing a substance that generates an active species that reacts with the workpiece, a liquid containing a substance that generates an active species that reacts with the workpiece, or a liquid containing an active species that reacts with the workpiece;

a measuring unit used when distribution of thickness of the workpiece is measured;

a laser beam irradiation unit having an adjuster that adjusts power of a laser beam;

a control unit that controls the adjuster based on the distribution of the thickness of the workpiece measured by using the measuring unit; and a circulation unit for circulating the gas or liquid along an annular flow path;

a separation unit for separating and removing an unnecessary substance generated due to the processing of the workpiece from the gas or liquid circulated in the annular flow path.

18. The processing apparatus according to claim 17, further comprising:

a container in which the workpiece is housed, wherein a window that allows the laser beam with which irradiation is executed from outside of the container to be transmitted through the window is disposed in the container.

* * * * *